(12) United States Patent
Ueno et al.

(10) Patent No.: US 6,985,097 B2
(45) Date of Patent: Jan. 10, 2006

(54) ERROR CORRECTION CIRCUIT AND A/D CONVERTER

(75) Inventors: Masayuki Ueno, Chiba (JP); Hiroshi Ogasawara, Chiba (JP); Masatoshi Takada, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 31 days.

(21) Appl. No.: 11/041,256

(22) Filed: Jan. 25, 2005

(65) Prior Publication Data

US 2005/0168368 A1    Aug. 4, 2005

(30) Foreign Application Priority Data

Jan. 29, 2004    (JP) .............................. 2004-020922

(51) Int. Cl.
*H03M 1/06*    (2006.01)
(52) U.S. Cl. ...................... 341/118; 341/156
(58) Field of Classification Search ................ 341/118, 341/155, 156, 159, 158
See application file for complete search history.

(56) References Cited

U.S. PATENT DOCUMENTS 5,568,149 A * 10/1996 Franson ...................... 341/156
6,069,579 A *  5/2000 Ito et al. ..................... 341/156
6,480,133 B2 * 11/2002 Kobayashi et al. ......... 341/156

\* cited by examiner

*Primary Examiner*—John B Nguyen
(74) *Attorney, Agent, or Firm*—Oliff & Berridge, PLC

(57) ABSTRACT

An error correction circuit and a folding ADC are provided. In the folding ADC, the range of the input voltage to an upper ADC circuit and to a lower ADC circuit is shifted by a predetermined voltage toward higher and lower electric potential sides. The error correction circuit outputs the conversion result of the upper bits as is, or corrects the conversion result of the upper bits by either subtracting or adding 1 from or to the conversion result of the upper bits in accordance with the least significant bit within the conversion result of the upper bits and in accordance with the polarity of a code having different polarities between a period in which the voltage level of one folding signal among a plurality of folding signals output from the folding circuit is higher than the center level and a period in which the voltage level is lower.

5 Claims, 5 Drawing Sheets

ERROR CORRECTION CIRCUIT AND A/D CONVERTER

BACKGROUND

The present invention relates to a folding A/D (analog/digital) converter (hereinafter referred to as an "ADC"), and an error correction circuit used in the folding ADC.

As described in a non-patent document (Kazuhide NANBA et al., "High Speed Low-Power Consumption A/D Converter", IEICE Technical Report, The Institute of Electronics, Information, and Communication Engineers, September 1999, ICD 99–161, pp. 1–8), a folding ADC performs analog/digital conversion by using a folding technology. As shown in FIG. 6, a folding ADC 30 includes an upper ADC circuit 32 for converting upper bits, a folding circuit 34 for converting lower bits, and a lower ADC circuit 36 for converting lower bits. Here, as the upper ADC circuit 32 and the lower ADC circuit 36, for example, a parallel comparison type (flash type) ADC circuit is used.

For example, when the upper ADC circuit 32 is two bits long, in the upper ADC circuit 32, three comparators are used in which three-level voltages V1, V2, and V3, which are obtained by dividing into four portions the section between the maximum value Vmax and the minimum value Vmin of an input voltage Vin of an analog signal, are each used as a reference voltage. In the upper ADC circuit 32, in each of the three comparators, by simultaneously comparing the input voltage Vin of an analog signal with each of the corresponding reference voltages V1, V2, and V3, two upper bits of a digital signal corresponding to the input voltage Vin of an analog signal are obtained.

The folding circuit 34 generates a folding signal having a voltage required for A/D conversion in the lower ADC circuit 36. As shown in FIG. 6, the output voltage Vout of the folding circuit 34 has output characteristics such that the voltage is folded in sequence at each of the corresponding reference voltages V1, V2, and V3 of the upper ADC circuit 32 with respect to the input voltage Vin of an analog signal.

In the lower ADC circuit 36, A/D conversion is performed based on the voltage level of the folding signal output from the folding circuit 34. For example, when the lower ADC circuit 36 is two bits long, in the lower ADC circuit 36, three-level reference signals, which are obtained by dividing into four portions the section between the maximum value and the minimum value of the output voltage of the folding signal, are used. In each of the three comparators, by simultaneously comparing the folding signal with each of the corresponding reference signals, two lower bits of a digital signal corresponding to the input voltage Vin of an analog signal are obtained.

In the folding ADC 30, by separately performing the upper bit conversion and the lower bit conversion, the number of comparators can be reduced, and thus a lower power consumption can be achieved. Furthermore, since the upper bit conversion and the lower bit conversion can be performed independently and simultaneously, the folding ADC 30 is suitable for achieving a higher speed.

However, as shown in FIG. 7, in the actual waveform of the folding signal, characteristics generally deteriorate in the peak portion and the valley portion of the folding signal when compared to an ideal waveform, indicated by the dotted line in FIG. 7. As such, the conversion accuracy of the lower bits deteriorates.

In order to reduce this deterioration, for example, when the lower ADC circuit 36 is two bits long, a technique is used in which four folding signals, whose output voltages of the lower ADC circuit 36 are shifted for each voltage of the analog signal by one bit with respect to the input voltage Vin of the analog signal, are generated, and in each of the four comparators, each voltage level of the four folding signals is simultaneously compared with the center level (zero-cross detection), thereby obtaining lower bits.

In the folding ADC 30, the overall conversion result is obtained by adding (combining) the conversion result of the upper bits by the upper ADC circuit 32 and the conversion result of the lower bits by the lower ADC circuit 36. However, in the technique described above, since the conversion of the upper bits by the upper ADC circuit 32 and the conversion by the folding circuit 34 and the lower ADC circuit 36 are performed independently, a mismatch may occur between them.

For example, as shown in FIG. 8, when it is assumed that the input voltage of an analog signal is at an "x" level, there are cases in which the conversion result of the upper bits becomes "01", the conversion result of the lower bits becomes "00", and the overall conversion result becomes "0100". However, when the conversion result of the lower bits is considered as a reference, the overall conversion result should become "1000". Such a mismatch between the conversion result of the upper bits and the conversion result of the lower bits can occur because of variations in devices forming the folding circuit 34 and the comparators.

As one means for solving this problem, an error correction circuit is known. FIG. 9 is a conceptual view illustrating the operation of an error correction circuit used in a two-step flash type ADC for two upper bits and two lower bits. As a result of using the error correction circuit illustrated in FIG. 9, for example, when "10" is obtained as the conversion result of the upper bits, in the lower ADC circuit, a conversion of the lower bits is performed in a range wider than the range of "10", which is the conversion result of the upper bits, and the conversion result of the upper bits is corrected in accordance with the conversion result of the lower bits.

In the case of an ADC with two upper bits and two lower bits, the number of necessary comparators is ideally a total of 6, that is, three for the upper bits and three for the lower bits. The number of comparators is smaller than 15, which is generally required when a 4-bit flash type ADC is formed. In the above-described example, as a result of performing error correction, a total of 10 comparators (○ in FIG. 9 indicates a comparator for a lower ADC circuit, ● and indicates a comparator for an error correction circuit), that is, three for the upper bits and seven for the lower bits, are required. Furthermore, a circuit for incrementing or decrementing by 1 the upper conversion result is necessary.

In the above-described example, an error correction circuit of a flash type ADC is described, and in the folding ADC, the identical error correction circuit is also necessary. However, as described above, in the conventional error correction circuit, there is a problem in that the circuit size becomes too large.

SUMMARY

An object of the present invention is to solve the above-described problems linked to conventional technology, to provide an error correction circuit having a small circuit size, which is used in a folding ADC, and to provide a folding ADC incorporating the error correction circuit.

To achieve the above-mentioned object, an exemplary implementation of the present invention provides an error correction circuit for use with a folding A/D converter including an upper A/D converter circuit for converting upper bits, a folding circuit and a lower A/D converter circuit for converting lower bits, wherein the range of an input voltage to the upper A/D converter circuit is shifted by a predetermined voltage towards a high electric potential side or towards a low electric potential side with respect to the range of an input voltage to the lower A/D converter circuit. Also, the upper bits are converted, and the conversion result of the upper bits, which is output from the upper A/D converter circuit, is corrected by using one folding signal from among a plurality of folding signals output from the folding circuit.

According to an exemplary implementation, the conversion result of the upper bits is output as is, or the conversion result of the upper bits is corrected by either subtracting or adding 1 from or to the conversion result of the upper bits in accordance with the least significant bit within the conversion result of the upper bits output from the upper A/D converter circuit and in accordance with the polarity of a code having different polarities between a period in which the voltage level of one folding signal among a plurality of folding signals output from the folding circuit is higher than the center level and a period in which the voltage level is lower than the center level.

In another exemplary implementation, a folding A/D converter includes an upper A/D converter circuit for converting upper bits, a folding circuit and a lower A/D converter circuit for converting lower bits, and an error correction circuit, wherein the upper A/D converter circuit outputs the upper bits of a digital signal corresponding to the input voltage of an analog signal, the folding circuit outputs a plurality of folding signals that have output characteristics such that the output voltages of the signals are folded in sequence at each of the corresponding reference voltages of the upper ADC circuit with respect to the input voltage of the analog signal and that are shifted for each voltage of the analog signal corresponding to one bit of the lower A/D converter circuit. Also, the lower A/D converter circuit may output the lower bits of the digital signal corresponding to the plurality of folding signals output from the folding circuit, the range of the input voltage to the upper A/D converter circuit is shifted toward a higher or lower electric potential side by a predetermined voltage with respect to the range of the input voltage to the lower A/D converter circuit, and the error correction circuit corrects the conversion result of the upper bits by using one folding signal from among the plurality of folding signals output from the folding circuit.

According to an exemplary implementation, the lower A/D converter circuit outputs a code having different polarities between a period in which the voltage level of one folding signal, from among a plurality of folding signals output from the folding circuit, is higher than the center level, and a period in which the voltage level is lower than the center level. Also, the error correction circuit may output the conversion result of the upper bits as is, or corrects the conversion result of the upper bits by either subtracting or adding 1 from or to the conversion result of the upper bits in accordance with the least significant bit within the conversion result of the upper bits output from the upper A/D converter circuit and in accordance with the polarity of a code having different polarities between a period in which the voltage level of one folding signal among a plurality of folding signals output from the folding circuit is higher than the center level and a period in which the voltage level is lower than the center level.

According to various exemplary implementations of the present invention, the range of the input voltage to the upper A/D converter circuit and the range of the input voltage to the lower A/D converter circuit are shifted by a predetermined voltage. By setting the error correction circuit 18 in advance to a state in which an error occurs, the error correction circuit can be simplified in construction. As a result, the circuit size of the error correction circuit, that is, the circuit size of the folding A/D converter incorporating this error correction circuit, can be greatly reduced.

DETAILED DESCRIPTION OF EMBODIMENTS

An error correction circuit and an A/D converter according to the present invention is described below with reference to the exemplary implementations shown in the attached drawings.

Figure 1:
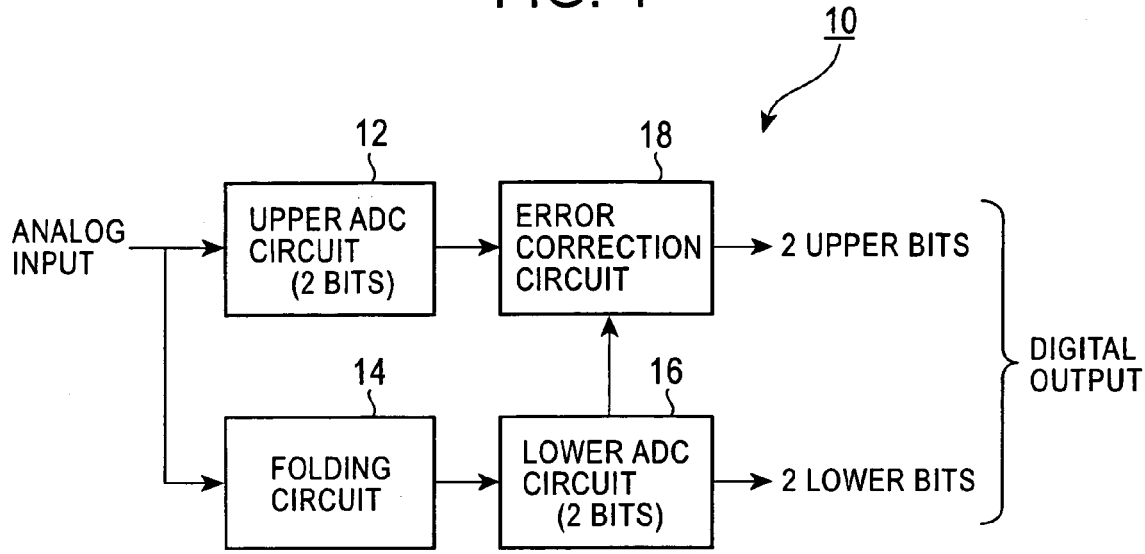
FIG. 1 is a block diagram of an exemplary embodiment of an A/D converter in which an error correction circuit is used.

FIG. 1 is a block diagram of an exemplary embodiment of an A/D converter in which an error correction circuit is used. According to various implementations, an A/D converter (hereinafter referred to as an "ADC") 10 shown in FIG. 1 is a folding A/D converter, and outputs a digital signal of a total of four bits, consisting of two upper bits and two lower bits, in accordance with an input voltage of an analog signal. According to various implementations, the A/D converter 10 includes an upper ADC circuit 12 for converting upper bits, a folding circuit 14 and a lower ADC circuit 16 for converting lower bits, and an error correction circuit 18.

According to various implementations, the upper ADC circuit 12 outputs two upper bits D3 and D2 of a digital signal corresponding to the input voltage of an analog signal.

Figure 2:
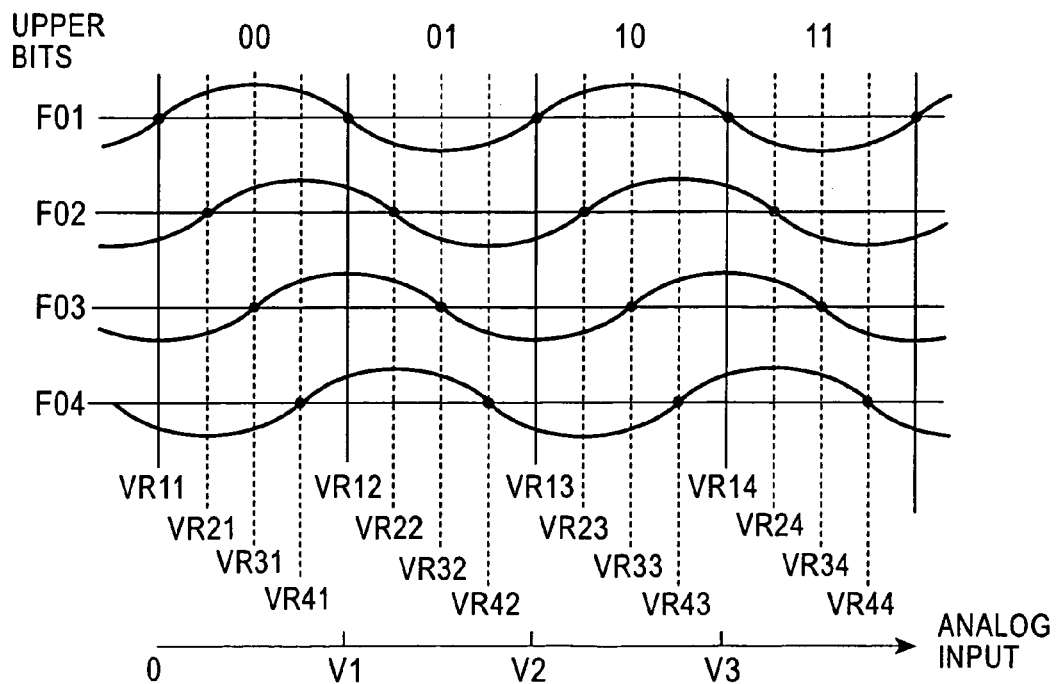
FIG. 2 is a timing chart showing the output waveform of an exemplary folding circuit shown in FIG. 1.

For the upper ADC circuit 12, a publicly known configuration, for example, a parallel comparison type ADC circuit, can be used. According to various implementations, in the upper ADC circuit 12, as shown in FIG. 2, three comparators are used in which three-level voltages V1, V2, and V3, which are obtained by dividing into four portions the section between the maximum value and the minimum value of the input voltage of the analog signal, are each used as a reference voltage. According to various implementations, in the upper ADC circuit 12, in each of the three comparators, by simultaneously comparing the input voltage of the analog signal with each of the corresponding, reference voltages V1, V2, and V3, the two upper bits D3 and D2 corresponding to the input voltage of the analog signal are obtained.

As shown in the timing chart of FIG. 2, the exemplary folding circuit 14 generates four folding signals F01, F02, F03, and F04 having a voltage required for A/D conversion of the two lower bits D1 and D0 in the lower ADC circuit 16.

According to various implementations, each of the output voltages of the folding signals F01, F02, F03, and F04 has output characteristics such that the voltage is folded in sequence at each of the corresponding reference voltages V1, V2, and V3 of the upper ADC circuit 12 with respect to the input voltage of the analog signal, that is, in correspondence with the conversion results "00", "01" "10", and "11" of the two upper bits. Furthermore, according to various implementations, in each of the folding signals F01, F02, F03, and F04, the output voltage of the signal is shifted for each voltage of the analog signal by one bit from the lower ADC circuit 16 with respect to the input voltage of the analog signal.

According to various implementations, the lower ADC circuit 16 outputs two lower bits D1 and D0 of a digital signal corresponding to the four folding signals F01, F02, F03, and F04 output from the folding circuit 14.

According to various implementations, in the lower ADC circuit 16, initially, four comparators simultaneously compare the voltage level of each of the corresponding folding signals F01, F02, F03, and F04 with the center level and convert each voltage level of the folding signals F01, F02, F03, and F04 into a 4-bit digital value. The digital value is set to "1", for example, when the voltage level of the folding signal is higher than the center level, and is set to "0" when the voltage level of the folding signal is lower than the center level.

Figure 3:
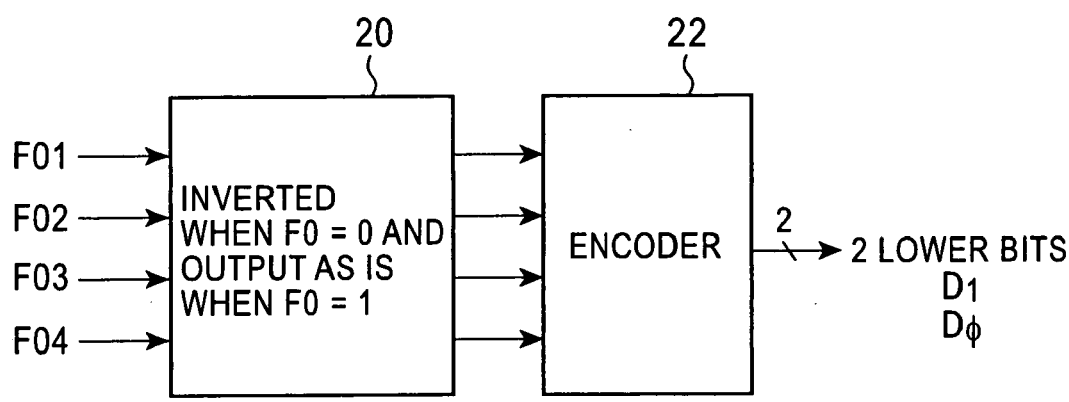
FIG. 3 is a block diagram showing the configuration of an exemplary lower ADC circuit shown in FIG. 1.

For example, the period in which the voltage level of the folding signal F01 is higher than the center level is set as code F0="1", and the period in which the voltage level of the folding signal F01 is lower than the center level is set as code F0="0". When code F0="11", which means that the voltage level of the folding signal is higher than the center level, as shown in FIG. 3, then the digital value is output as is by a bit inversion circuit 20. When code F0="0", which means that the voltage level of the folding signal is lower than the center level, then the digital value is inverted and output.

According to various implementations, the 4-bit digital value output from the bit inversion circuit 20 is encoded by an encoder 22, and two lower bits D1 and D0 of a digital value are obtained.

For example, as shown in Table 1, when the digital values of the folding signals F01, F02, F03, and F04 are "1000", that is, when the input voltage of the analog signal is greater than or equal to VR11 and less than VR21, the digital value (="1000") is output as is from the bit inversion circuit 20. This value is encoded by the encoder 22, and the two lower bits D1 and D0 (="00") of the digital signal are output. When the digital values are "1100", "1110", or "1111", these values are output as is, and the two lower bits D1 and D0 (= "01", "10", and "11") of the digital signal are output.

According to various implementations, when the digital values of the folding signals F01, F02, F03, and F04 are "0111", that is, when the input voltage of the analog signal is greater than or equal to VR12 and less than VR22, "1" and "0" of the digital value (= "0111") are inverted and "1000" is output from the bit inversion circuit 20. This value is encoded by the encoder 22, and the two lower bits D1 and D0 (="06") of the digital signal are output. When the digital values are "0011", "0001", or "0000", similarly, these values are inverted, and "1100", "1110", or "1111" are output. These values are encoded by the encoder 22, and two lower bits D1 and D0 (="0", "10", and "11") of the digital signal are output.

TABLE 1

| F01 | 1 | 1 | 1 | 1 | 0 | 0 | 0 | 0 |
|---|---|---|---|---|---|---|---|---|
| F02 | 0 | 1 | 1 | 1 | 1 | 0 | 0 | 0 |
| F03 | 0 | 0 | 1 | 1 | 1 | 1 | 0 | 0 |
| F03 | 0 | 0 | 0 | 1 | 1 | 1 | 1 | 0 |
| $D_1$ | 0 | 0 | 1 | 1 | 0 | 0 | 1 | 1 |
| $D_2$ | 0 | 1 | 0 | 1 | 0 | 1 | 0 | 1 |

According to various implementations, the error correction circuit 18 corrects the conversion result of the two lower bits D3 and D2 in accordance with the bit D2 (the least significant bit among the upper bits) on a lower order side from among the two lower bits D3 and D2 output from the upper ADC circuit 12 and the code F0 of the folding signal F01 (the inversion signal of the folding signal F01) output from the lower ADC circuit 16.

Figure 4:
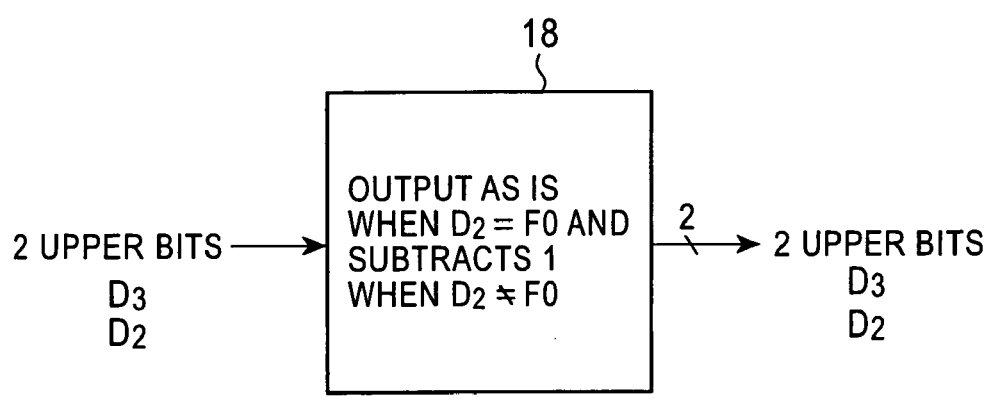
FIG. 4 is a block diagram showing the configuration of an exemplary error correction circuit shown in FIG. 1.
Figure 5:
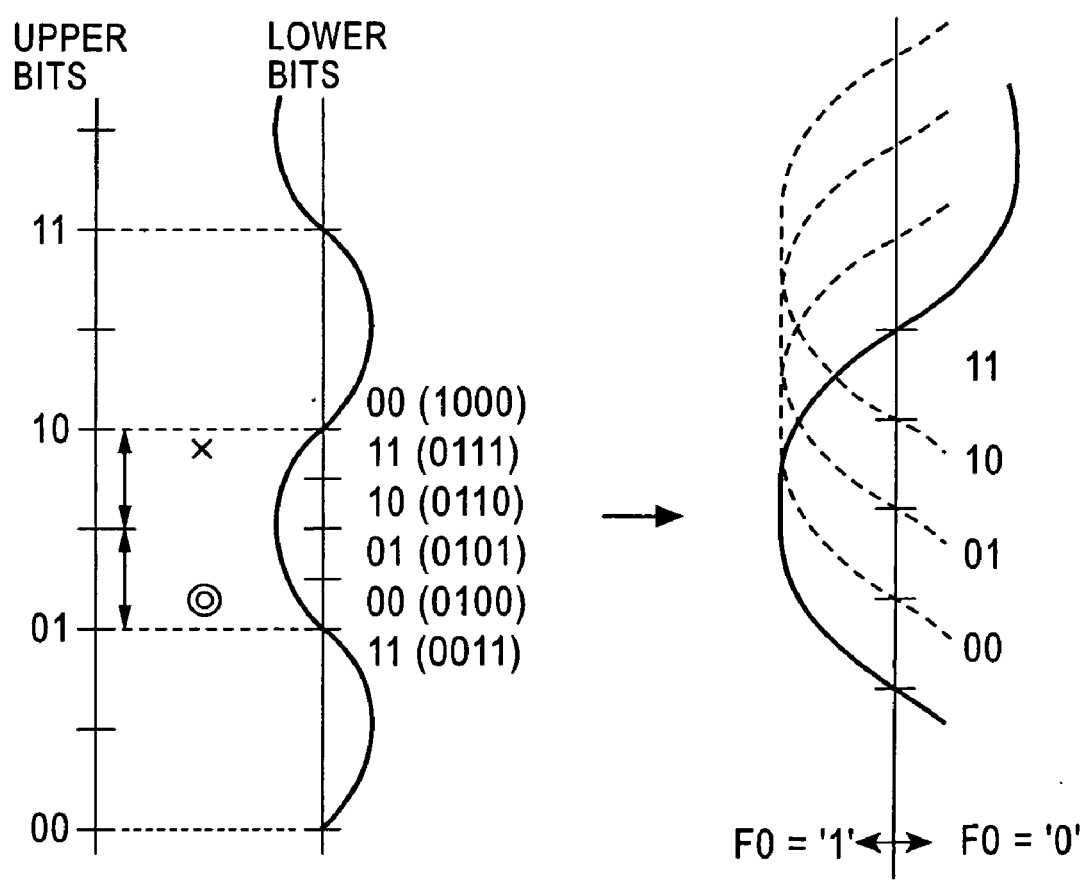
FIG. 5 is a conceptual view illustrating the operation of the exemplary A/D converter shown in FIG. 1.
Figure 6:
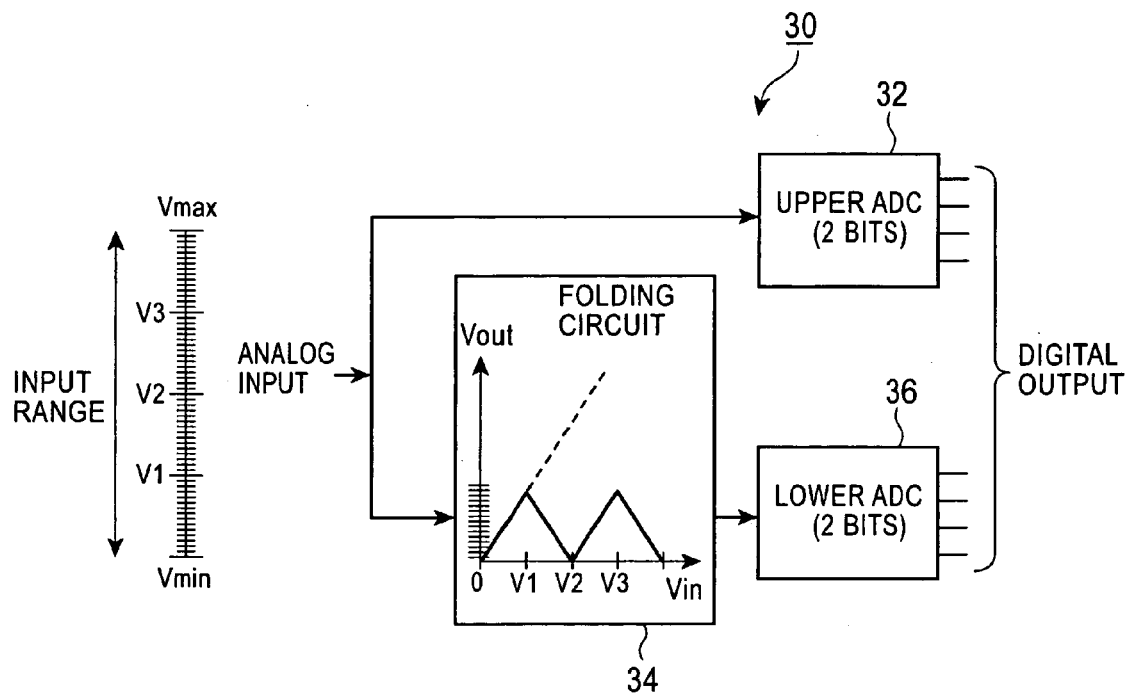
FIG. 6 is a block diagram of an example of a conventional A/D converter.
Figure 7:
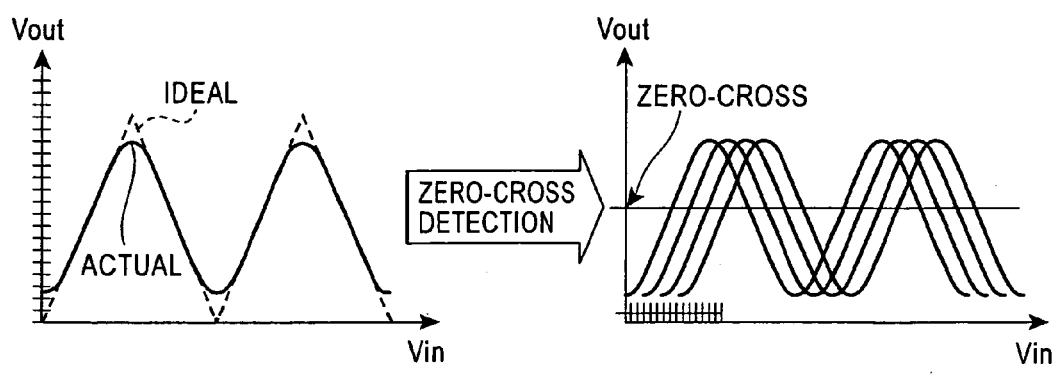
FIG. 7 is a timing chart showing the output waveform of a conventional folding circuit shown in FIG. 6.
Figure 8:
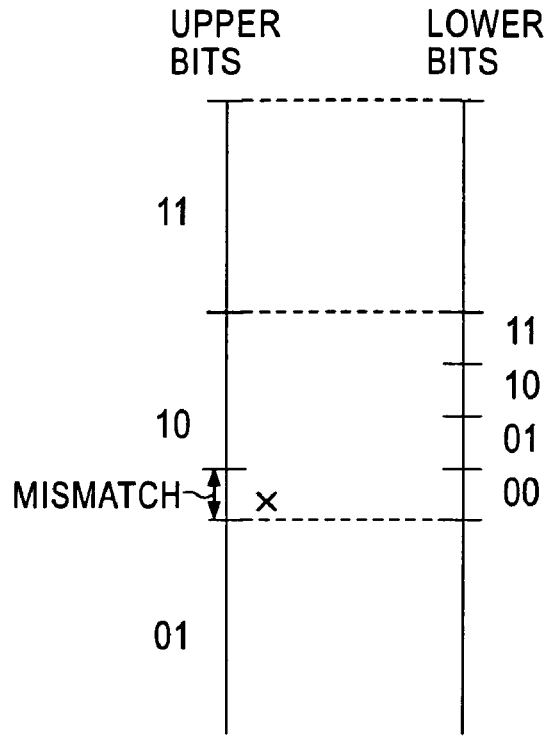
FIG. 8 is a conceptual view illustrating the operation of the conventional A/D converter shown in FIG. 6.
Figure 9:
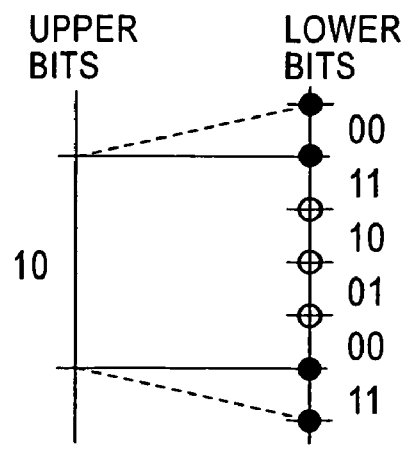
FIG. 9 is a conceptual view illustrating the operation of an error correction circuit used in a conventional A/D converter.

According to various implementations, as shown in FIG. 5, the range of the input voltage to the upper ADC circuit 12 is shifted toward the lower electric potential side by a voltage of approximately half of the voltage range of the analog signal corresponding to one bit of the upper ADC circuit 12 with respect to the range of the input voltage to the lower ADC circuit 16. In this case, as shown in FIG. 4, when the upper bit D2 equals the code F0, the conversion result of the two lower bits D3 and D2 is output as is from the error correction circuit 18. When the upper bit D2 is different from the code F0, a value such that 1 is subtracted from the conversion result of the two lower bits D3 and D2 is output.

As shown in FIG. 5, for example, when the input voltage of the analog signal is at a level indicated by "x", the two lower bits D3 and D2 (="10") are output from the upper ADC circuit 12, and the two lower bits D1 and D0 (="11") are output from the lower ADC circuit 16. That is, since the upper bit D2 (="0") is different from the code F0 (="1") of the folding signal, "01" such that 1 is subtracted from "10", which is the conversion result of the two upper bits D3 and D2, is output as the conversion result of the two upper bits from the error correction circuit 18, and "0111" is obtained as the overall conversion result.

According to various implementations, the input voltage of the analog signal is indicated by "◉", the two upper bits D3 and D2 (="01") are output from the upper ADC circuit 12, and the two lower bits D1 and D0 (="00") are output from the lower ADC circuit 16. That is, since the upper bit D2 (="1") equals the code F0 (="1") of the folding signal, "01", which is the conversion result of the two upper bits D1 and D0, is output as the conversion result of the two upper bits from the error correction circuit 18, and "0100" is obtained as the overall conversion result.

In a conventional folding ADC, errors are prevented as much as possible by making common the reference voltage used in the upper ADC circuit and the lower ADC circuit, and when an error occurs, it is corrected. For this reason, there is a problem in that the circuit size of the error correction circuit is large. In contrast, in the exemplary error correction circuit 18 discussed above, by setting the error correction circuit 18 in advance to a state in which an error occurs in the manner described above, the error correction circuit 18 can be simplified. Consequently, the circuit size of the error correction circuit 18, that is, the circuit size of the ADC 10 incorporating the error correction circuit 18, can be greatly reduced.

Also, the total number of the bits of the digital signal and the number of the upper bits and the lower bits are not limited at all.

In the example shown in FIG. 5, the range of the input voltage to the upper ADC circuit 12 may be shifted toward a higher electric potential side by a voltage of approximately half of the voltage range of the analog signal corresponding to one bit of the upper ADC circuit with respect to the range of the input voltage of the lower ADC circuit 16. In this case, when the upper bit D2 equals the code F0, the conversion result of the two upper bits D3 and D2 is output as is from the error correction circuit 18. When the upper bit D2 is different from the code F0, a value such that 1 is added to the conversion result of the two upper bits D3 and D2 is output from the error correction circuit 18.

According to various implementations, to which degree the range of the input voltage to the upper ADC circuit and the range of the input voltage to the lower ADC circuit should be shifted may be determined as appropriate. In the exemplary error correction circuit, in order to facilitate error detection using a simple circuit, as described above, the range of the input voltage to the upper ADC circuit and the range of the input voltage to the lower ADC circuit are shifted by a voltage of approximately half of the voltage range of the analog signal corresponding to one bit of the upper ADC circuit.

The code of the folding signal may be determined based on any one folding signal from among a plurality of folding signals. Furthermore, the polarity of the code may be changed as appropriate.

For example, in the case of the illustration shown in FIG. 5, the period in which the voltage level of the folding signal F01 is on a higher electric potential side than the center level is set as the code F0="1", and the period on a lower electric potential side is set as the code F0="0". Conversely, for example, the period in which the voltage level of the folding signal F01 is on a higher electric potential side than the center level may be set an the code F0="0" and the period on a lower electric potential side may be set as the code F0="1".

That is, in accordance with the polarity of the least significant bit of the upper bits and the polarity of the code of the folding signal, the conversion result of the upper bits is output as is, or 1 is subtracted or added from or to the conversion result of the upper bits.

While the invention has been described in conjunction with exemplary embodiments, these embodiments should be viewed as illustrative, not limiting. Various modifications, substitutes, or the like are possible within the spirit and scope of the invention.

What is claimed is:

1. An error correction circuit for use with a folding A/D converter comprising:
    an upper A/D converter circuit for converting upper bits; and
    a folding circuit and a lower A/D converter circuit for converting lower bits,
    wherein a range of an input voltage to said upper A/D converter circuit is shifted by a predetermined voltage towards a high electric potential side or towards a low electric potential side with respect to the range of an input voltage to said lower A/D converter circuit, and the upper bits are converted, and
    the conversion result of the upper bits output from said upper A/D converter circuit is corrected by using one of folding signals output from said folding circuit.

2. The error correction circuit according to claim 1, wherein the conversion result of said upper bits is output as is, or the conversion result of said upper bits is corrected by either subtracting or adding 1 from or to the conversion result of said upper bits in accordance with the least significant bit within the conversion result of the upper bits output from said upper A/D converter circuit and in accordance with the polarity of a code having different polarities between a period in which the voltage level of one of the folding signals output from said folding circuit is higher than a center level and a period in which the voltage level is lower than the center level.

3. A folding A/D converter comprising:
    an upper A/D converter circuit for converting upper bits;
    a folding circuit and a lower A/D converter circuit for converting lower bits; and
    an error correction circuit,
    wherein said upper A/D converter circuit outputs the upper bits of a digital signal corresponding to an input voltage of an analog signal;
    said folding circuit outputs folding signals that have output characteristics such that output voltages of the folding signals are folded in sequence at each of corresponding reference voltages of said upper ADC circuit with respect to said input voltage of the analog signal and that are shifted for each voltage of the analog signal corresponding to one bit of said lower A/D converter circuit;
    said lower A/D converter circuit outputs the lower bits of the digital signal corresponding to folding signals output from said folding circuit;
    the range of the input voltage to said upper A/D converter circuit is shifted toward a higher or lower electric potential side by a predetermined voltage with respect to the range of the input voltage to said lower A/D converter circuit; and
    said error correction circuit corrects the conversion result of said upper bits by using one of the folding signals output from said folding circuit.

4. The A/D converter according to claim 3, wherein said lower A/D converter circuit outputs a code having different polarities between a period in which the voltage level of one of the folding signals output from said folding circuit is higher than the center level and a period in which the voltage level is lower than the center level; and
    said error correction circuit outputs the conversion result of said upper bits as is, or corrects the conversion result of said upper bits by either subtracting or adding 1 from or to the conversion result of said upper bits in accordance with the least significant bit within the conversion result of the upper bits output from said upper A/D converter circuit and in accordance with the polarity of a code having different polarities between a period in which the voltage level of one of folding signals output from said folding circuit is higher than the center level and a period in which the voltage level is lower than the center level.

5. An error correction method for use with a folding A/D converter for performing upper bit conversion and lower bit conversion in parallel, said error correction method comprising the steps of:
    shifting the range of an input voltage in upper bit conversion by a predetermined voltage towards a higher or lower electric potential side with respect to a range of an input voltage in lower bit conversion; and
    outputting a conversion result of said upper bits as is, or correcting the conversion result of said upper bits by either subtracting or adding 1 from or to the conversion result of said upper bits in accordance with a least significant bit within the conversion result of the upper bits output from said upper A/D converter circuit and in accordance with a polarity of a code having different polarities between a period in which a voltage level of one of folding signals output from said folding circuit is higher than a center level and a period in which the voltage level is lower than the center level.

* * * * *